United States Patent
Lee et al.

(10) Patent No.: US 10,811,162 B2
(45) Date of Patent: Oct. 20, 2020

(54) METHOD FOR HEALING DEFECT OF CONDUCTIVE LAYER, METHOD FOR FORMING METAL-CARBON COMPOUND LAYER, 2D NANO MATERIALS, TRANSPARENT ELECTRODE AND METHOD FOR MANUFACTURING THE SAME

(71) Applicants: Industry-Academic Cooperation Foundation, Yonsei University, Seoul (KR); Incheon University Industry Academic Cooperation Foundation, Incheon (KR)

(72) Inventors: Taeyoon Lee, Seoul (KR); Jong Hyun Ahn, Seoul (KR); Juree Hong, Gyeonggi-do (KR); Jae-Bok Lee, Seoul (KR); Han-Bo-Ram Lee, Seoul (KR)

(73) Assignees: Industry-Academic Cooperation Foundation, Yonsei University, Seoul (KR); Incheon University Industry Academic Cooperation Foundation, Incheon (KR)

( * ) Notice: Subject to any disclaimer, the term of this patent is extended or adjusted under 35 U.S.C. 154(b) by 379 days.

(21) Appl. No.: 15/196,820

(22) Filed: Jun. 29, 2016

(65) Prior Publication Data

US 2017/0004899 A1  Jan. 5, 2017

(30) Foreign Application Priority Data

Jun. 30, 2015 (KR) .................. 10-2015-0092699

(51) Int. Cl.
 *B32B 9/00* (2006.01)
 *H01B 1/04* (2006.01)
 *H01L 31/18* (2006.01)
 *B82Y 30/00* (2011.01)

(52) U.S. Cl.
 CPC ........... *H01B 1/04* (2013.01); *H01L 31/1884* (2013.01); *B82Y 30/00* (2013.01); *Y10T 428/30* (2015.01)

(58) Field of Classification Search
 CPC ........ Y10T 428/30; C01B 31/04; B82Y 30/00
 (Continued)

(56) References Cited

U.S. PATENT DOCUMENTS

2013/0071616 A1* 3/2013 Miller ................. B05C 3/20
 428/138
2014/0021163 A1* 1/2014 Everett .............. B81C 1/00158
 216/17

FOREIGN PATENT DOCUMENTS

JP  H 11-349305  12/1999
KR  10-2013-0108580  10/2013
 (Continued)

OTHER PUBLICATIONS

Hassan, Microwave synthesis of graphene sheets supporting metal nanocrystals, J. Mater. Chem. May 12, 2009, 19, 3832-3837.*
 (Continued)

*Primary Examiner* — Daniel H Miller
(74) *Attorney, Agent, or Firm* — Procopio, Cory, Hargreaves & Savitch LLP

(57) ABSTRACT

Provided are method for healing defect of conductive layer, method for forming metal-carbon compound layer, 2D nano materials, and transparent electrode and method for manufacturing the same. According to an embodiment of present invention, the method for healing defect of conductive layer comprises: forming a conductive layer on a first metal substrate; contacting the first metal substrate with a salt solution containing a second metal in an ionic form, and
 (Continued)

forming a second metal particle at least in a portion of a conductive area, the second metal having greater reduction potential than a first metal.

5 Claims, 11 Drawing Sheets

(58) Field of Classification Search
USPC .......................................... 428/408; 423/448
See application file for complete search history.

(56) References Cited

FOREIGN PATENT DOCUMENTS

| KR | 10-2014-0018538 A | 2/2014 |
|---|---|---|
| KR | 10-2014-0090015 | 7/2014 |
| KR | 10-2014-0111916 A | 9/2014 |
| KR | 10-2015-0011989 | 2/2015 |
| KR | 10-2015-0130119 A | 11/2015 |
| WO | WO 2012/150763 | 11/2012 |
| WO | WO 2014/123319 | 8/2014 |

OTHER PUBLICATIONS

Batzill, M., The Surface Science of Graphene: Metal Interfaces, CVD Synthesis Nanoribbons, Chemical Modifications, and Defects, Surface Science Reports, 67, 2012, pp. 83-115.
Office Action for KR App No. 10-2015-0092699 dated Jul. 1, 2016.
Notice of Allowance for KR App No. 10-2015-0092699 dated Mar. 9, 2017.

* cited by examiner

Forming a conductive layer on a first metal substrate — S100

↓

Forming a second metal particle at least in a portion of a conductive layer — S200

Contacting a salt solution containing a second metal ion in the ionic from with a first metal substrate having a conductive layer — S210

↓

Forming a second metal particle on the defect of a conductive layer by the galvanic displacement reaction between the first metal and a second metal ion — S220

METHOD FOR HEALING DEFECT OF CONDUCTIVE LAYER, METHOD FOR FORMING METAL-CARBON COMPOUND LAYER, 2D NANO MATERIALS, TRANSPARENT ELECTRODE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2015-0092699, filed on Jun. 30, 2015, the entire contents of which are hereby incorporated by reference.

BACKGROUND OF THE INVENTION

The present invention disclosed herein relates to method for healing defect of conductive layer, method for forming metal-carbon compound layer, 2D Nano materials, transparent electrode and method for manufacturing the same.

Graphene, a $sp^2$ compound of carbon atomic in the form of a hexagonal two-dimensional single atomic layer, is widely studied as a promising key material of future nano device because of its high charge carrier mobility at room temperature and outstanding mechanical and physical characteristics.

As graphene is composed of single atomic layer, it is transparent, flexible and carries high conductivity, and elasticity. Therefore, it is in the spotlight as foldable electrode.

However, when growing graphene in large scale, there are defects on the graphene's surface such as wrinkle, void, fold, and grain boundary thus decreasing graphene's electric conductivity and electric charge mobility.

Therefore, not to reduce graphene's own properties, it is required a method to heal defect without modifying structure of $sp^2$ compound of carbon atomic.

SUMMARY OF THE INVENTION

The present invention provides a method for healing a defect of a conductive layer at low cost and not damaging structure of the conductive layer.

The present invention also provides a method for forming metal-carbon compound layer at low cost.

The present invention also provides a method for manufacturing transparent electrode while maintaining high transmittance and low sheet resistance by using the method for healing a defect of a conductive layer.

The objects of the inventive concept are not limited to the above mentioned objects. Other objects thereof will be understandable by those skilled in the art from the following descriptions.

According to an aspect of the present invention, a method for healing a defect of a conductive layer comprises: forming a conductive layer on the first metal substrate; and, contacting a salt solution with the first metal substrate and forming a second metal particle at least in a portion of the conductive layer, the salt solution containing a second metal in an ionic form, the second metal having a larger reduction potential than a first metal of the first metal substrate.

In an embodiment, in the forming a second metal particle at least in a portion of the conductive layer, an electron formed by oxidizing a first metal moves to a surface of the conductive layer through the conductive layer, and the second metal ion contained in the salt solution gains the electrode and is reduced.

In an embodiment, the forming a second metal particle at least in a portion of the conductive layer comprises forming the second metal particle selectively in the defect of the conductive layer.

In an embodiment, the forming a second metal particle at least in a portion of the conductive layer comprises immersing the first metal substrate having the conductive layer in the salt solution.

In an embodiment, immersing the first metal substrate in the salt solution comprises immersing the first metal substrate in the salt solution for about one minute to about twenty minutes.

In an embodiment, the concentration of the salt solution may be less than 1 mM.

In an embodiment, the conductive layer may be a carbon layer.

In an embodiment, the carbon layer may comprise graphene.

According to another aspect of the present invention, a method for forming a metal-carbon compound layer comprises: forming a carbon layer on a first metal substrate; and forming a second metal particle at least in a portion of the carbon layer, a second metal of the second metal particle having a greater reduction potential than a first metal of the first metal substrate.

In an embodiment, the forming a second metal particle comprises contacting a salt solution with the first metal substrate, the salt solution containing the second metal in an ionic form.

In an embodiment, the contacting a salt solution with the first metal substrate comprises immersing the first metal substrate having the carbon layer in the salt solution.

According to another aspect of the present invention, a 2D nano material comprises: a first metal substrate; a carbon layer on the first metal substrate; and a second metal particle at least in a portion of the carbon layer, the second metal of the second metal particle having greater reduction potential than a first metal of the first metal substrate.

In an embodiment, the second metal particle may be formed in the defect of the carbon layer.

In an embodiment, the carbon layer may comprise graphene, and the defect may comprise graphene's grain boundary.

According to another aspect of the present invention, a method of manufacturing a transparent electrode comprises: forming a conductive layer on a first metal substrate; contacting a salt solution with the first metal substrate and forming a second metal particle at least in a portion of the conductive layer, the salt solution containing a second metal in an ionic form, the second metal having a greater reduction potential than a first metal of the first metal substrate; and, removing the first metal substrate.

In an embodiment, the forming a second metal particle at least in a portion of the conductive layer comprises forming the second metal particle selectively in the defect of the conductive layer.

According to another aspect of the present invention, a transparent electrode comprises a graphene; and a metal particle formed in the defect of the graphene.

In an embodiment, the defect of the graphene may comprise a graphene's grain boundary.

According to an embodiment of the present invention, a defect of a conductive layer may be healed at low cost, not damaging the structure of the conductive layer.

According to an embodiment of the present invention, a metal-carbon compound layer may be formed at low cost.

According to another embodiment of the present invention, a transparent electrode may be manufactured with high transmittance and low sheet resistance.

The objects of the inventive concept are not limited to the above mentioned effects. Other objects thereof will be understandable by those skilled in the art from the following descriptions.

BRIEF DESCRIPTION OF THE DRAWINGS

FIG. 1 is a flowchart of explaining a method, 100 for healing defect of conductive layer, in accordance with an embodiment of the present invention.

FIG. 2 is a flowchart of explanation forming a second metal particle S200 of FIG. 1

DETAILED DESCRIPTION

Figure 3:
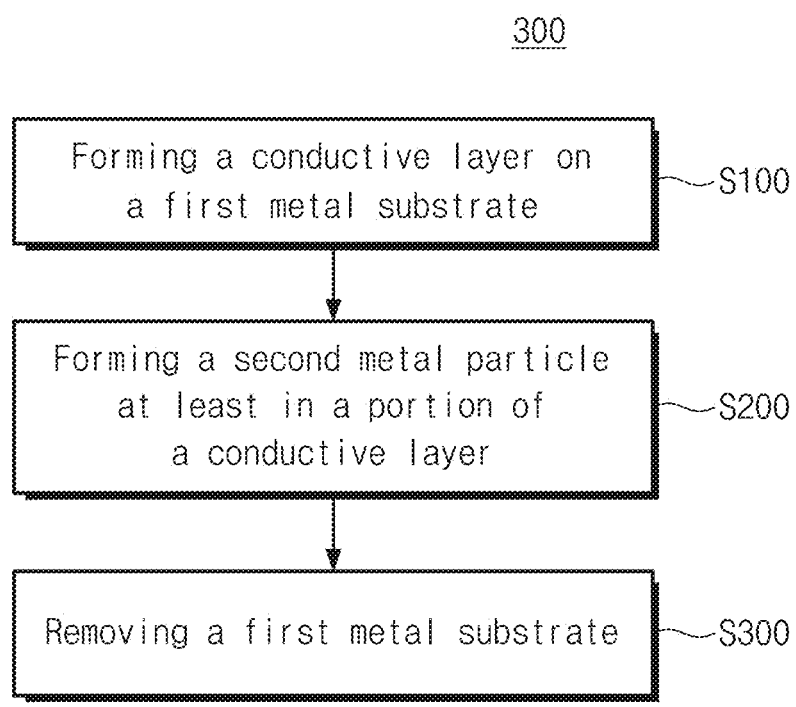
FIG. 3 is a flowchart explaining a method for manufacturing a transparent electrode, in accordance with an embodiment of the present invention

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical and scientific terms) used herein have the same meaning as generally understood by those skilled in the art. Moreover, detailed descriptions related to well-known functions or configurations will be ruled out in order not to unnecessarily obscure subject matters of the inventive concept. It is also noted that like reference numerals denote like elements in appreciating the drawings. A portion of components in the drawings may be exaggerated or reduced for helping understanding of the inventive concept.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," "including," "have," "having," etc., when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

A method for healing defect of conductive layer according to embodiments of the inventive concept comprises forming a conductive layer on a first metal substrate, and contacting the first metal substrate with a salt solution containing a second metal in an ionic form. The second metal has a greater reduction potential than a first metal of the first metal substrate. The first metal is oxidized and the second metal is reduced via galvanic displacement reaction between the first metal and the second metal ion, and a second metal particle is formed in a defect of the conductive layer to heal the defect. Specifically, an electron, which is formed as the first metal got oxidized, moves to the surface of the conductive layer, and the second metal ion gains the electron thus being reduced, thereby the second metal particle can be formed on the surface of the conductive layer. In this case, when a defect exists in the conductive layer, the electron moves to the defect part which is reactive, and the second metal ion gains the electron and thus is reduced, thereby forming the second metal particle selectively in the defect of the conductive layer. Herein, in order to make a reaction between the second metal ion and the first metal, the first metal substrate having the conductive layer may be immersed in the salt solution.

The conductive layer may be a non-metal conductive layer. For example, the conductive layer could be comprised of a graphene, containing carbon, or CNT.

The defect of the conductive layer may include grain boundary, wrinkle, void, or crack that reduces the electrical property of the conductive layer.

Also, according to another embodiment of the present invention, a method for forming metal-carbon compound layer may use the same method as the method for healing defect of conductive layer described above, and may form a second metal particle on a carbon layer at low cost by controlling the reaction time between a first metal and the salt solution containing a second metal ion and by controlling the concentration of the salt solution.

In addition, according to another embodiment of the present invention, a method for manufacturing transparent electrode may use the same method as the method for healing defect of conductive layer described above. That is, a metal particle can be formed selectively in a portion of a transparent conductive layer, for example, in a defect region, and thus a transparent electrode with a low sheet resistance can be formed while not degrading greatly transmittance. For example, the transparent conductive layer may be a graphene.

Various example embodiments will be described more fully hereinafter with reference to the accompanying drawings, in which some example embodiments are shown.

FIG. 1 is a flow chart of explaining a method for healing defect of conductive layer, 100 according to an embodiment of the present invention.

As shown in FIG. 1, according to an embodiment of the present invention, the method for healing defect of conductive layer comprises: forming a conductive layer on the first metal substrate, S100; forming a second metal particle at least in a portion of the conductive layer, S200.

In forming the conductive layer on the first metal substrate S100, the conductive layer may be a non-metal conductive layer. For example, the conductive layer may be graphene, containing carbon, or conductive layer, containing CNT. In an embodiment, in case of graphene, on the first metal substrate graphene can be grown by CVD.

In forming the second metal particle at least in a portion of conductive layer, S200, the salt solution containing a second metal in an ionic form is contacted with the first metal substrate to cause a galvanic displacement reaction.

FIG. 2 is a flowchart explaining forming the second metal particle S200 shown in FIG. 1.

As shown in FIG. 2, forming the second metal particle, S200 may comprise: contacting the salt solution containing the second metal ion in the ionic form with the first metal substrate having the conductive layer, S210, and forming the second metal particle on defect of the conductive layer by a galvanic displacement reaction between the first metal and the second metal ion.

The contacting the salt solution containing the second metal in the ionic form with the first metal substrate having the conductive layer, S210 may comprise immersing the first metal substrate in the salt solution. In this case, by controlling the concentration of the salt solution and immersing time, the second metal may be formed in a portion of the conductive layer, for example, in a defect region of the conductive layer or a metal layer of the second metal particle may be formed on the whole region of the conductive layer. In an embodiment, the second metal particle may be formed selectively in the defective region when the first metal substrate having the conductive layer is immersed in the salt solution having less than 1 mM concentration for 1~20 minutes. When immersed under 1 minute, the second metal particle may not be formed well, and when immersed exceeds 20 minutes, the second metal particle may be formed overall and the defect of the conductive layer may not be selectively healed.

In forming the second metal particle on the defect of the conductive layer by the galvanic displacement reaction between the first metal and a second metal ion, the second metal particle may be formed via oxidation of the first metal and reduction of the second metal ion that has larger reduction potential than the first metal. That is, as the first metal reacts with the second metal ion that has larger reduction potential than the first metal, the first metal gets oxidized by losing an electron. The electron generated by the oxidation of the first metal, moves to the surface of conductive layer through the high electron mobility conductive layer, and the second metal ion gets reduced by gaining an electron thereby the second metal particle may be formed on the surface of conductive layer. The portion of the conductive layer where the second metal particle is formed may be a defect region of the conductive layer. The defect region of conductive layer has different surface energy from a defect free region of the conductive layer and the defect region is very reactive, and thus the electron generated by the oxidation of the first metal moves to the defect region preferentially. As a result, the second metal particle may be formed selectively and preferentially in the defect region.

FIG. 3 is a flowchart explaining a method for manufacturing a transparent electrode, 300 according to an embodiment of the present invention As shown in FIG. 3, according to an embodiment of the present invention, the method for manufacturing a transparent electrode comprise forming a conductive layer on a first metal substrate, S100; forming a second metal particle at least in a portion of the conductive layer, S200; and removing the first metal substrate, S300.

That is, according to an embodiment of present invention, the method for manufacturing the transparent electrode comprises steps S100 and S200 in FIG. 1 and FIG. 2. In the case that the second metal particle forms on the conductive layer of a first metal substrate, the transparent electrode can be manufactured by removing the first metal substrate. In this case, conductive layer may be a non-metal conductive layer having transparency.

In an embodiment, the non-metal conductive layer having transparency may be graphene having high transmittance. According to an embodiment of the present invention, a metal nano particle may be formed selectively on the defect of the conductive layer without modifying structure of conductive layer, and thus a metal nano particle may be formed selectively on the defect of the graphene without modifying $sp^2$ of graphene. As a result, by forming the metal nano particle in the graphene's defect region which may reduce graphene's electrical property, the sheet resistance of the graphene can be lowered without lowering greatly transmittance and thus can be used as transparent electrode.

Figure 4A:
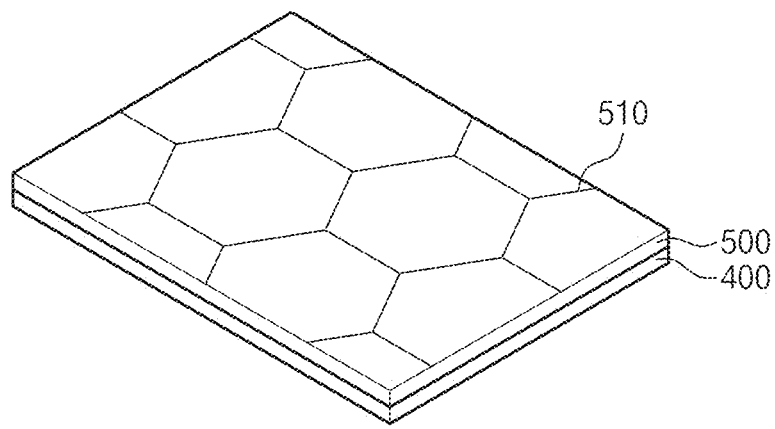
FIGS. 4a and 4b are diagrams to explain common steps for healing defect of the conductive layer and forming a metal-carbon compound layer, in accordance with an embodiment of the present invention.
Figure 4B:
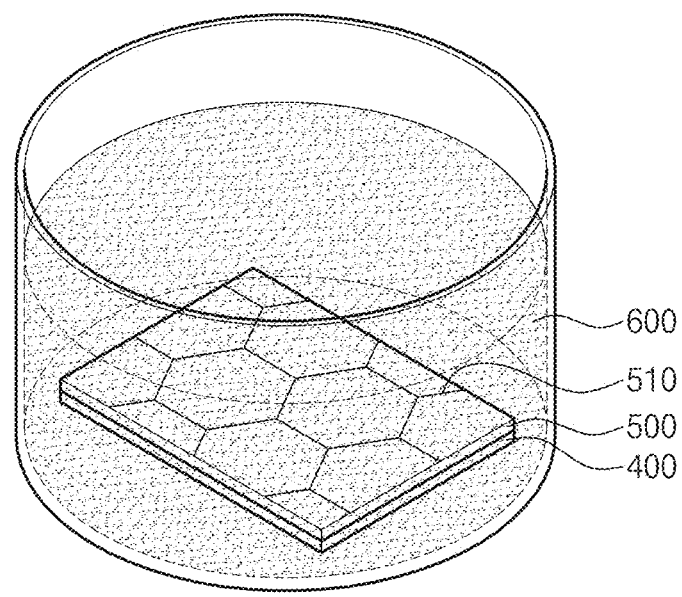

FIGS. 4a and 4b are diagrams explaining common steps for healing the defect of the conductive layer and forming the metal-carbon compound layer according to an embodiment of present invention.

First of all, as shown in FIG. 4a, conductive layer 500 may be formed on a first metal substrate 400. The Conductive layer 500 may include a defect region 510. The Conductive layer 500 may be a non-metal conductive layer. For example, the conductive layer 510 may be a carbon layer, containing carbon, as like as graphene or CNT.

After forming the conductive layer 500 on the first metal substrate 400, as shown in FIG. 4b, the first metal substrate 400 having the conductive layer 500 may be immersed in a salt solution 600. The salt solution 600 may contain an ion of a second metal. The second metal has larger reduction potential than the first metal of the first metal substrate 400. For example, the first metal may be Cu or Ni, and the second metal may be Ag, Pd, Pt, or Au, but it is not limited thereto.

That is, according to an embodiment of the present invention, the method for healing the defect of the conductive layer and the method for manufacturing the metal-carbon compound layer have common steps as shown in FIG. 4a and FIG. 4b. Depending on reaction time of the first metal substrate having the conductive layer and on the concentration of the salt solution, the defect of the conductive layer may be healed or the metal-carbon compound layer may be formed.

Figure 5:
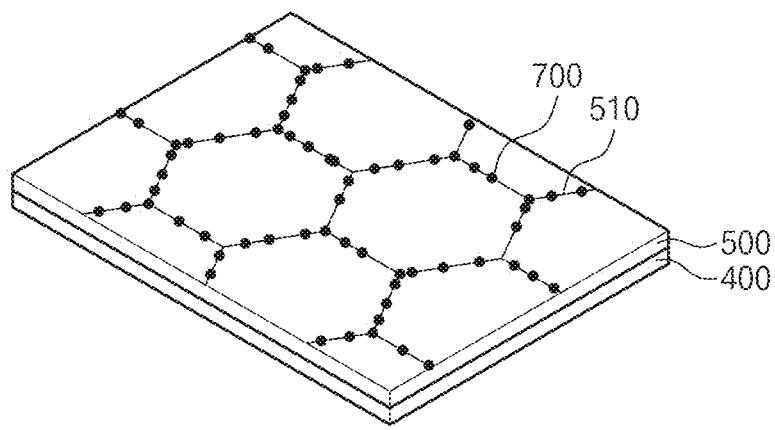
FIGS. 5 and 6 are diagrams of 2D nano material, in accordance with an embodiment of the present invention
Figure 6:
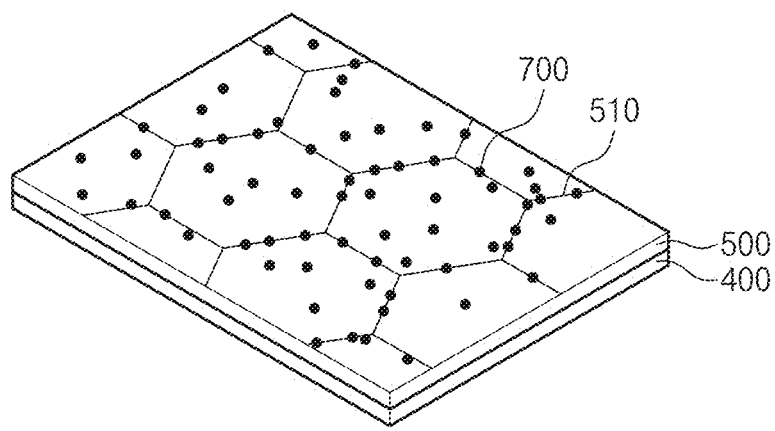

FIG. 5 and FIG. 6 are diagrams showing 2D nano material according to an embodiment of present invention.

FIG. 5 is an image of 2D nano material, where the defect of the conductive layer is healed, according to an embodiment of the present invention. As shown in FIG. 5, 2D nano material may comprise a first metal substrate 400, a conductive layer 500 on the first metal substrate 400, and a second metal particle 700 on the defect region 510 of the conductive layer 500. The second metal of the second metal particle 700 has larger reduction potential than the first metal of the first metal substrate 400. For example, the conductive layer 500 is carbon layer and may be graphene, and the defect region 510 of the conductive layer 500 may be graphene's grain boundary.

FIG. 6 is an image of 2D nano material, where metal-carbon compound layer is formed, according to an embodiment of present invention. As shown in FIG. 6, a second metal particle may be formed overall in the conductive layer 500. The second metal of the second metal particle has larger reduction potential than the first metal of the first metal substrate 400. For example, the conductive layer 500 may be a carbon layer, and the second metal particle is formed overall on the carbon layer, thereby forming a metal layer.

Hereinafter, exemplary embodiments of the present invention will be described in detail.

Exemplary Embodiments

First of all, a single layer of graphene was grown by CVD on Cu foil substrate. Then, $PdCl_2$ was mixed with DI water to prepare $PdCl_2$ salt solutions of various concentrations. And then, as shown in FIG. 4*b*, Cu foil substrate on which graphene has been grown, was immersed in the $PdCl_2$ salt solution for variety of time. At last, Cu foil substrate on which graphene has been grown was taken out of the $PdCl_2$ salt solution and then cleansed in DI water.

FIGS. 7*a* to 7*c* and FIGS. 8*a* to 8*c* are field-emission FE-SEM images of 2D nano material, in accordance with an embodiment of the present invention.

Figure 7A:
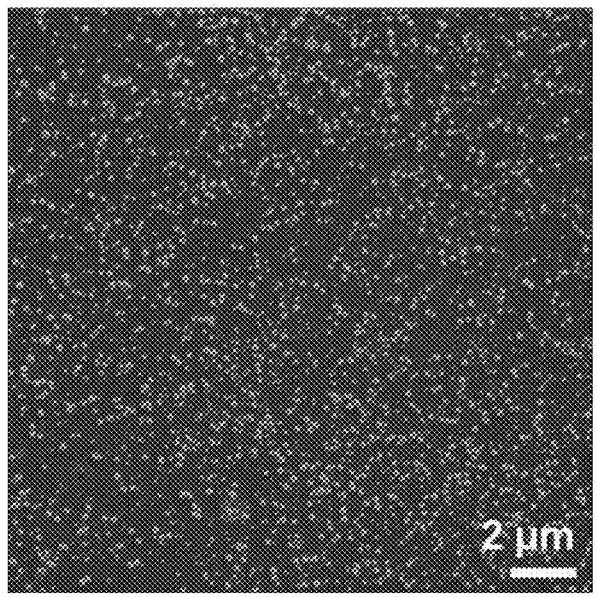
FIGS. 7a to 7c and FIGS. 8a to 8c are field-emission FE-SEM images of 2D nano material, in accordance with an embodiment of the present invention.
Figure 7B:
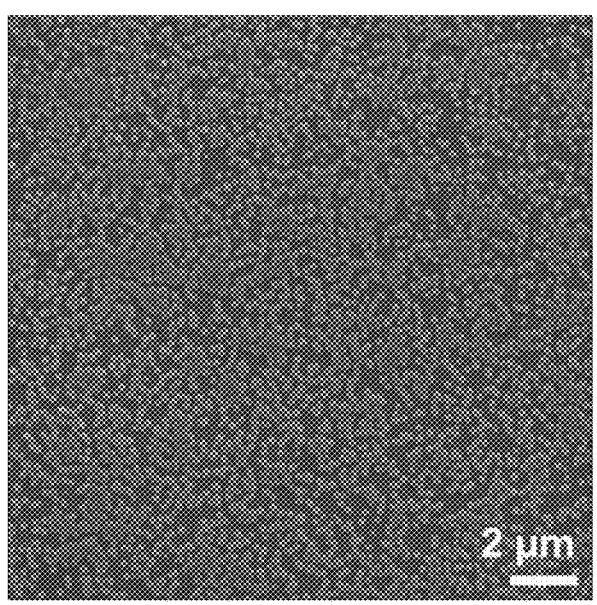
Figure 7C:
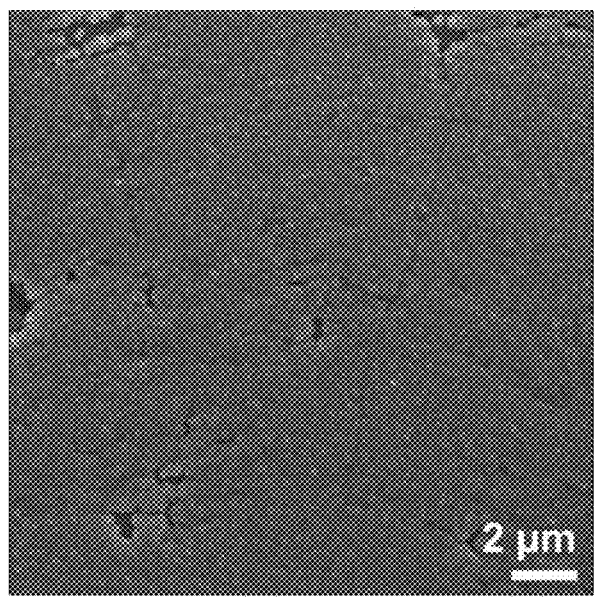

FIGS. 7*a* to 7*c* are FE-SEM images of 2D nano material formed by immersing the Cu foil substrate on which graphene has been grown in the $PdCl_2$ salt solution 0.5 mM for one minute (FIG. 7*a*), ten minutes (FIG. 7*b*), and thirty minutes (FIG. 7*c*) in the exemplary embodiments as described above.

Figure 8A:
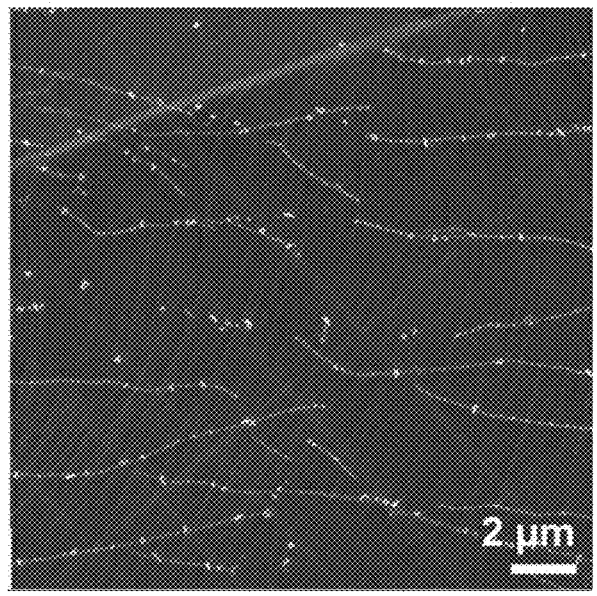
Figure 8B:
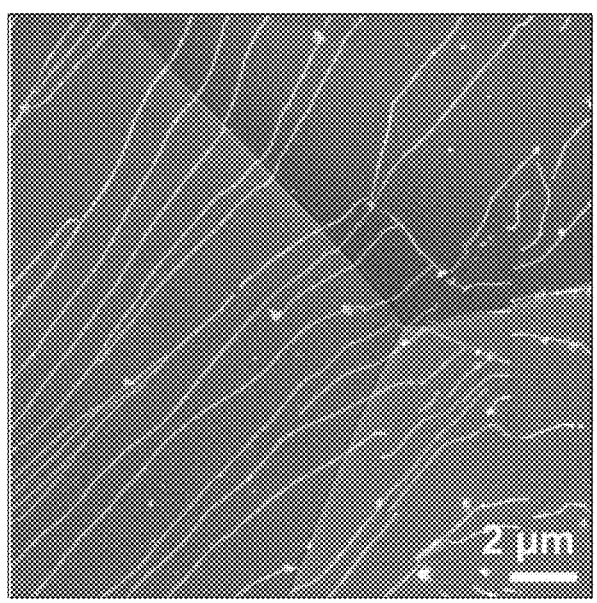
Figure 8C:
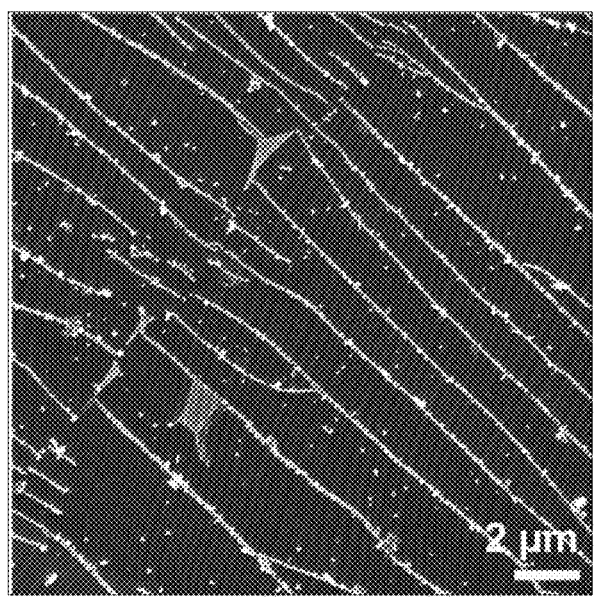

FIGS. 8*a* to 8*c* are FE-SEM images of 2D nano material formed by immersing the Cu foil substrate on which graphene has been grown in the $PdCl_2$ salt solution 00.5 mM for each one minute (FIG. 8*a*), five minutes (FIG. 8*b*), and fifteen minutes (FIG. 8*c*).

Referring to FIGS. 7*a* to 7*c* and 8*a* to 8*c*, it was confirmed that when the concentration of the $PdCl_2$ salt solution is high, Pd metal particle is formed overall on the graphene as shown in FIGS. 7*a* to 7*c*. When the concentration of the $PdCl_2$ salt solution is low, Pd metal particle is formed selectively on the defect region as shown in FIGS. 8*a* to 8*c*.

Figure 9A:
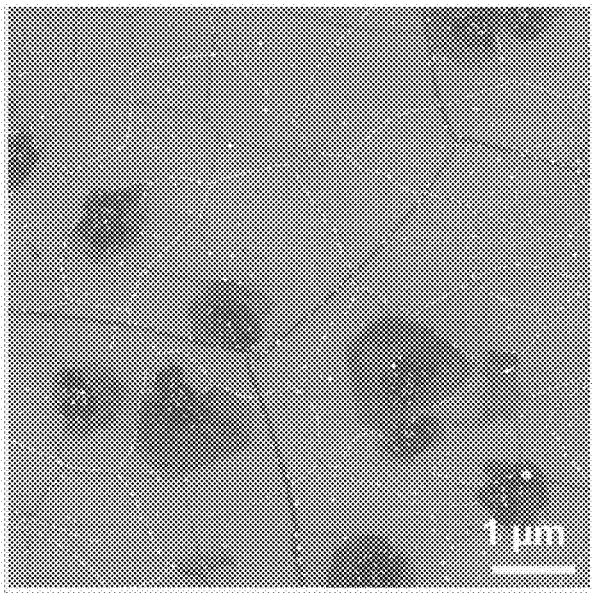
FIGS. 9a to 9c are SEM, AFM, and TEM image of the surface of 2D nano material, in accordance with an embodiment of the present invention.
Figure 9B:
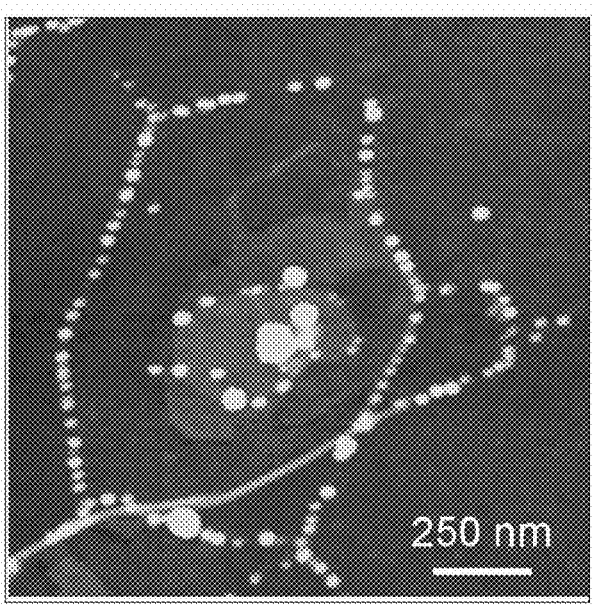
Figure 9C:
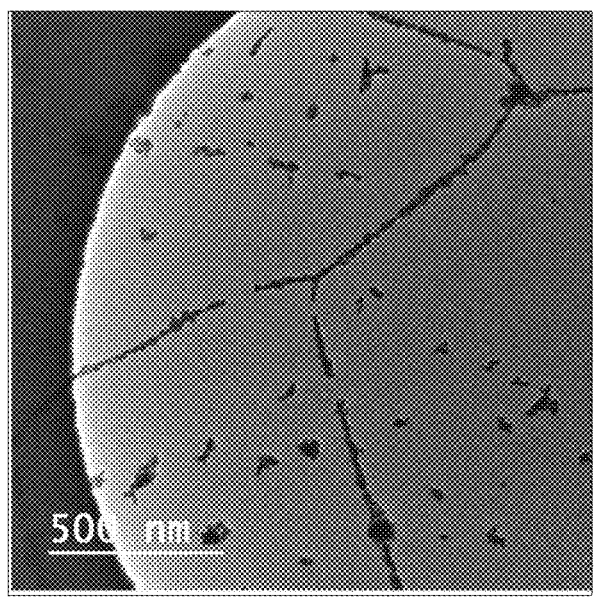

FIGS. 9*a* to 9*c* are SEM, AFM, and TEM images of surface of 2D nano material formed according to an embodiment of present invention. Referring to FIGS. 9*a* to 9*c*, it was confirmed that Pd nano particle was formed along the graphene's grain boundary.

Figure 10A:
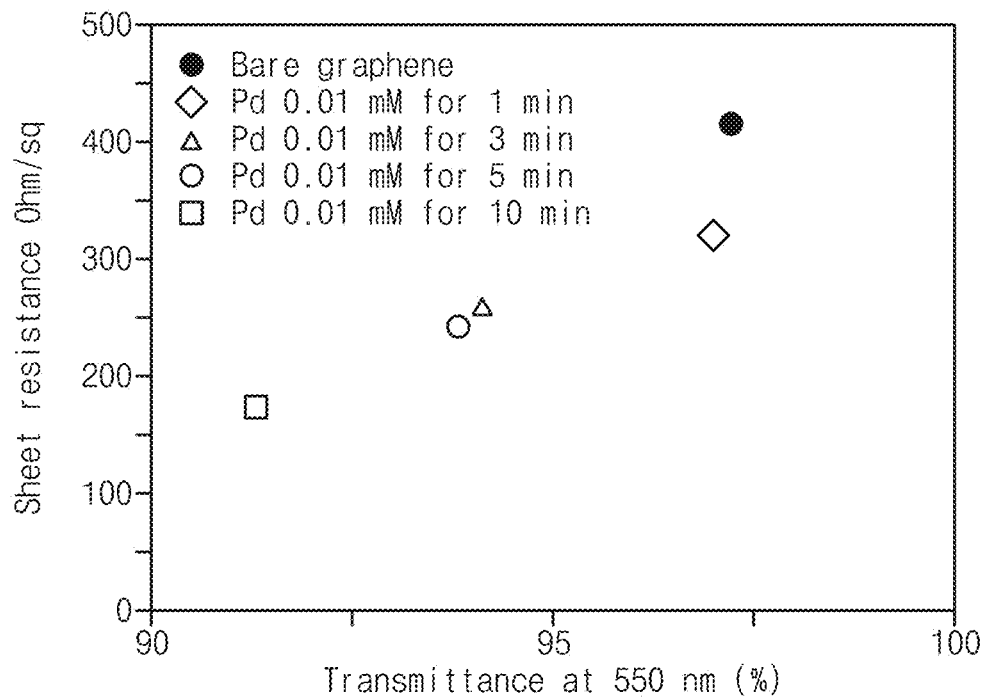
FIGS. 10a and 10b are graphs showing sheet resistance and transmittance of a transparent electrode manufactured by a method of manufacturing transparent electrode, in accordance with an embodiment of the present invention.
Figure 10B:
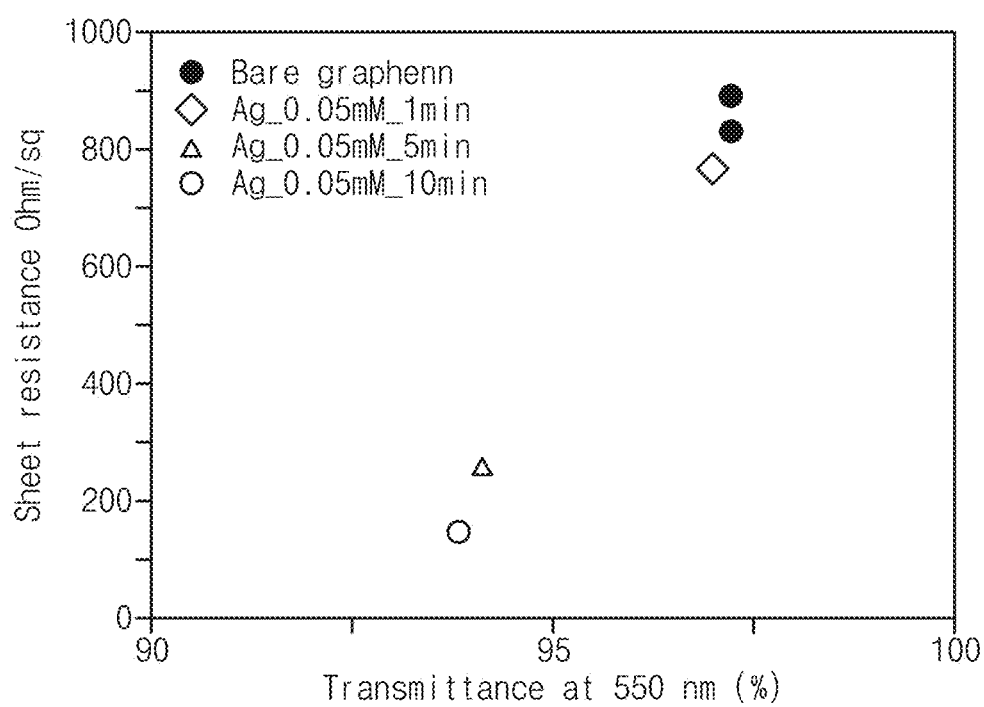

FIGS. 10*a* and 10*b* are graphs illustrating sheet resistance and transmittance of the transparent electrode formed by a method for manufacturing transparent electrode according to an embodiment of present invention. Here, the transmittance is transmittance of light having 550 nm wavelength.

FIG. 10*a* shows the sheet resistance and transmittance of the transparent electrode formed by the previously described exemplary embodiments using 0.01 mM $PdCl_2$ salt solution and varying the immersing time.

FIG. 10*b* shows the sheet resistance and transmittance of the transparent electrode formed by the previously described exemplary embodiments using 0.05 mM $AgNO_3$ salt solution and varying the immersing time Referring to FIGS. 10*a* and 10*b*, when graphene is bare graphene, transmittance is high but also sheet resistance is high, thus, it is difficult to be used as transparent electrode. According to an embodiment of the present invention, when Pd or Ag nano material is formed, over 90% of transmittance is maintained and sheet resistance is noticeably decreased. Thus, it was confirmed that graphene may be used as transparent electrode.

Foregoing embodiments are provided to help understanding of the inventive concept, but do not limit the scope of the inventive concept, and thus those with ordinary skill in the technical field of the inventive concept pertains will be understood that the inventive concept can be carried out in other specific forms without changing the technical idea or essential features. For example, each component, described in an embodiment of the present invention, may be implemented as dispersing the components. Also, dispersed components may be combined and be implemented. Therefore, the technical scope of protection of the inventive concept will be determined by the technical idea of the scope of the appended claims, and also will be understood as not being limited to the literal description in itself, but reaching the equivalent technical values of the inventive concept.

What is claimed is:

1. A method of healing a defect of a conductive layer comprising:
   forming a conductive layer on a first metal substrate;
   forming a second metal particle at least in a portion of the conductive layer by contacting a salt solution with the first metal substrate, the salt solution containing a second metal in ionic form, the second metal in ionic form having a larger reduction potential than the first metal substrate;
   oxidizing the first metal substrate by contacting the salt solution with the first metal substrate, and reducing the second metal in ionic form contained in the salt solution to form the second metal particle,
   wherein an electron is generated by the oxidation of the first metal substrate by the contacting the salt solution with the first metal substrate, the electron moves from the first metal substrate to a surface of the conductive layer through the conductive layer, and the second metal in ionic form contained in the salt solution gains the electron and is reduced, and
   wherein the second metal particle is formed in the conductive layer without modifying sp2 structure of the conductive layer by contacting the salt solution with the first metal substrate,
   wherein the conductive layer comprises a graphene, and wherein the salt solution comprises $PdCl_2$.

2. The method of claim 1, wherein the forming a second metal particle at least in a portion of the conductive layer comprises, forming the second metal particle selectively in the conductive layer.

3. The method of claim 1, wherein the forming a second metal particle at least in a portion of a conductive layer comprises, immersing a first metal substrate having the conductive layer in the salt solution.

4. The method of claim 3, wherein the immersing a first metal substrate having the conductive layer in the salt solution comprises, immersing the first metal substrate having the conductive layer in the salt solution for about one minute to twenty minutes.

5. The method of claim 3, wherein the concentration of the salt solution is less than 1 mM.

* * * * *